(12) United States Patent
Mutou et al.

(10) Patent No.: US 9,620,697 B2
(45) Date of Patent: Apr. 11, 2017

(54) THERMOELECTRIC CONVERSION MATERIAL

(71) Applicants: KYUSHU INSTITUTE OF TECHNOLOGY, Kitakyushu-shi (JP); LINTEC CORPORATION, Itabashi-ku (JP)

(72) Inventors: Tsuyoshi Mutou, Itabashi-ku (JP); Koji Miyazaki, Kitakyushu (JP); Yoshika Hatasako, Kitakyushu (JP); Kunihisa Kato, Itabashi-ku (JP)

(73) Assignees: KYUSHU INSTITUTE OF TECHNOLOGY, Kitakyushu-shi (JP); LINTEC CORPORATION, Itabashi-ku (JP)

( * ) Notice: Subject to any disclaimer, the term of this patent is extended or adjusted under 35 U.S.C. 154(b) by 0 days.

(21) Appl. No.: 14/379,987

(22) PCT Filed: Feb. 19, 2013

(86) PCT No.: PCT/JP2013/054031
§ 371 (c)(1),
(2) Date: Aug. 20, 2014

(87) PCT Pub. No.: WO2013/125534
PCT Pub. Date: Aug. 29, 2013

(65) Prior Publication Data
US 2015/0013741 A1    Jan. 15, 2015

(30) Foreign Application Priority Data

Feb. 24, 2012 (JP) ................................. 2012-039377

(51) Int. Cl.
*H01L 35/16* (2006.01)
*H01L 35/22* (2006.01)
(Continued)

(52) U.S. Cl.
CPC .............. *H01L 35/24* (2013.01); *H01L 35/16* (2013.01); *H01L 35/18* (2013.01); *H01L 35/32* (2013.01); *H01L 35/34* (2013.01)

(58) Field of Classification Search
None
See application file for complete search history.

(56) References Cited

U.S. PATENT DOCUMENTS

2002/0158342 A1* 10/2002 Tuominen et al. ........... 257/784
2002/0170590 A1* 11/2002 Heremans et al. ........... 136/240
(Continued)

FOREIGN PATENT DOCUMENTS

| | | |
|---|---|---|
| CN | 102132430 | 7/2011 |
| JP | 2958451 | 10/1999 |

(Continued)

OTHER PUBLICATIONS

Mansky et al., Appl. Phys. Lett., 68 (18), Apr. 29, 1996.*
(Continued)

*Primary Examiner* — Eli Mekhlin
(74) *Attorney, Agent, or Firm* — Oblon, McClelland, Maier & Neustadt, L.L.P.

(57) ABSTRACT

The present invention provides a thermoelectric conversion material of which the structure is controlled to have nano-order microscopic pores and which has a low thermal conductivity and has an improved thermoelectric performance index. In the thermoelectric conversion material having a thermoelectric semiconductor layer formed on a block copolymer substrate that comprises a block copolymer having microscopic pores, wherein the block copolymer comprises a polymer unit (A) formed of a monomer capable of forming a homopolymer having a glass transition temperature of 50° C. or higher, and a polymer unit (B) formed of a conjugated dienic polymer.

15 Claims, 3 Drawing Sheets

(51) Int. Cl.
*H01L 35/24* (2006.01)
*H01L 35/34* (2006.01)
*H01L 35/18* (2006.01)
*H01L 35/32* (2006.01)

(56) References Cited

U.S. PATENT DOCUMENTS

| | | | |
|---|---|---|---|
| 2005/0031277 A1* | 2/2005 | Japon | 385/109 |
| 2005/0257821 A1* | 11/2005 | Ramanathan | H01L 23/38 |
| | | | 136/203 |
| 2007/0277866 A1 | 12/2007 | Sander et al. | |
| 2008/0178921 A1* | 7/2008 | Ye | 136/225 |
| 2009/0142256 A1 | 6/2009 | Wakayama et al. | |
| 2010/0236596 A1 | 9/2010 | Lee et al. | |
| 2011/0000224 A1* | 1/2011 | Ghoshal et al. | 62/3.7 |
| 2011/0257285 A1* | 10/2011 | Barriau et al. | 521/156 |
| 2011/0281085 A1 | 11/2011 | Tada et al. | |

FOREIGN PATENT DOCUMENTS

| | | |
|---|---|---|
| JP | 2009 539261 | 11/2009 |
| JP | 2011 105780 | 6/2011 |
| JP | 2011 243655 | 12/2011 |
| JP | 2013 65669 | 4/2013 |

OTHER PUBLICATIONS

U.S. Appl. No. 14/382,439, filed Sep. 2, 2014, Kato, et al.
Makoto Kashiwagi, et al., "MNM-4A-5 Thermoelectric thin film deposition on a porous alumina", The Japan Society of Mechanical Engineers, pp. 179 and 180, (Oct. 12, 2010) (with partial English translation).
International Search Report Issued May 28, 2013 in PCT/JP13/054031 Filed Feb. 19, 2013.
Office Action issued Mar. 1, 2016 in Chinese Patent Application No. 201380010650.8

\* cited by examiner

THERMOELECTRIC CONVERSION MATERIAL

CROSS REFERENCE TO RELATED APPLICATION

This application is a 371 of PCT/JP2013/054031, filed on Feb. 19, 2013, and claims priority to Japanese Patent Application 2012-039377, filed on Feb. 24, 2012.

TECHNICAL FIELD

The present invention relates to a thermoelectric conversion material that carries out energy interconversion between heat and electricity, and especially relates to a thermoelectric conversion material having a high thermoelectric performance index, and to its production method.

BACKGROUND ART

Recently, a thermoelectric power-generating technology for which the system is simple and can be down-sized has been specifically noted as a power recovery technology for unharnessed waste heat energy that is generated from fossil fuel resources and others used in buildings, factories, etc. However, thermoelectric power generation is, in general, poorly efficient in power generation, and therefore, studies and developments are being actively made for improving power generation efficiency in various companies and research institutes. For improving power generation efficiency, it is indispensable to enhance the efficiency of thermoelectric conversion materials, and for realizing it, it is desired to develop materials having a high electric conductivity comparable to that of metals and having a low thermal conductivity comparable to that of glass.

A thermoelectric conversion characteristic can be evaluated by a thermoelectric performance index Z ($Z=\sigma S^2/\lambda$). Here, S means a Seebeck coefficient, $\sigma$ means an electric conductivity (reciprocal of resistivity), and $\lambda$ means a thermal conductivity. Increasing the value of the thermoelectric performance index Z improves the power generation efficiency, and for enhancing the efficiency in power generation, it is important to find out a thermoelectric conversion material having a large Seebeck coefficient and a large electric conductivity $\sigma$, and having a small thermal conductivity $\lambda$.

In general, the thermal conductivity $\lambda$ and the electric conductivity $\sigma$ of a solid substance can be planned using the density of the material and the carrier concentration as parameters; however, the two physical properties are not independent of each other owing to the Wiedemann-Franz law but coordinate closely with each other, and therefore, in fact, it has heretofore been impossible to significantly improve the thermoelectric performance index. Given the situation, PTL 1 proposes a thermoelectric conversion material that has been prepared by introducing a large number of supermicroscopic pores into the inside of a semiconductor material as dispersed therein at intervals equal to or smaller than the mean free path of electrons and phonons, so as to make the material porous to thereby reduce the thermal conductivity and increase the Seebeck coefficient thereof. According to Examples in PTL 1, the thermal conductivity reduced but the electric conductivity also reduced (the resistivity greatly increased), and the non-dimensional thermoelectric performance index ZT (at T, absolute temperature, 300 K) merely increased from 0.017 to 0.156 through porous structure formation, and the situation is that the absolute value is far from the index value for practical use, $ZT \geq 1$.

In PTL 2, there is given an investigation for forming a micro-cylinder structure, in which, on a coating film formed of a coating liquid that contains a general-purpose polymer such as polystyrene or the like and a hydrophobic organic solvent such as methylene chloride or the like, a nano- or micro-scale water vapor-containing gas, of which the dew point is controlled to be higher than the temperature of the coating film, is sprayed and condensed thereon, and the vaporization of water condensed in the hydrophobic organic solvent is stepwise repeated. In this, however, it is difficult to control the condition, and in particular, the distance between the pores is fluctuated, the pore area proportion is small, and therefore the structure is not suitable for a porous structure for use for a thermoelectric conversion material.

CITATION LIST

Patent Literature

PTL 1: Japanese Patent 2958451
PTL 2: JP-A 2011-105780

SUMMARY OF INVENTION

Technical Problem

In consideration of the above-mentioned situation, an object of the present invention is to provide a thermoelectric conversion material of which the structure is controlled to have nano-order microscopic pores and which has a low thermal conductivity and has an improved thermoelectric performance index.

Solution to Problem

The present inventors have assiduously made repeated studies for solving the above-mentioned problems and, as a result, have found, when a thermoelectric semiconductor layer of a film of a p-type bismuth telluride or an n-type bismuth telluride is formed on a substrate of a block copolymer that comprises a polymer unit (A) and a polymer unit (B) (polymer unit (A)-b-polymer unit (B), where b means that the polymer unit (A) and the polymer unit (B) form a block copolymer), then the thermoelectric performance index is greatly increased, and have completed the present invention.

Specifically, the present invention provides the following (1) to (9):
(1) A thermoelectric conversion material having a thermoelectric semiconductor layer formed on a block copolymer substrate that comprises a block copolymer having microscopic pores, wherein the block copolymer comprises a polymer unit (A) formed of a monomer capable of forming a homopolymer having a glass transition temperature of 50° C. or higher, and a polymer unit (B) formed of a conjugated dienic polymer.
(2) The thermoelectric conversion material according to the above (1), wherein the polymer unit (A) comprises polystyrene.
(3) The thermoelectric conversion material according to the above (1) or (2), wherein the polymer unit (B) comprises polyisoprene.
(4) The thermoelectric conversion material according to any of the above (1) to (3), wherein the number-average molecular weight of the polymer unit (A) in the block copolymer is from 500 to 500,000, the number-average molecular weight of the polymer unit (B) therein is from 500 to 500,000, and the content of the polymer unit (B) is from 1 to 40% by mass.

(5) The thermoelectric conversion material according to any of the above (1) to (4), wherein the depth of the microscopic pores is from 5 to 1,000 nm and the mean diameter thereof is from 5 to 1,000 nm.

(6) The thermoelectric conversion material according to any of the above (1) to (5), wherein the film thickness of the thermoelectric semiconductor layer is from 10 to 500 nm.

(7) The thermoelectric conversion material according to any of the above (1) to (6), wherein the thermoelectric semiconductor layer is formed of a p-type bismuth telluride or an n-type bismuth telluride.

(8) The thermoelectric conversion material according to any of the above (1) to (7), wherein the p-type bismuth telluride is $Bi_XTe_3Sb_{2-X}$ where $0<X\leq0.6$.

(9) The thermoelectric conversion material according to any of the above (1) to (7), wherein the n-type bismuth telluride is $Bi_{2.0}Te_{3-Y}Se_Y$ where $0<Y\leq3$.

Advantageous Effects of Invention

According to the present invention, there is obtained a thermoelectric conversion material of which the structure is controlled to have nano-order microscopic pores and which has a low thermal conductivity and therefore has an improved thermoelectric performance index as a total, and the thermoelectric conversion material can realize a high conversion efficiency.

DESCRIPTION OF EMBODIMENTS

Thermoelectric Conversion Material

The thermoelectric conversion material of the present invention is a thermoelectric conversion material having a thermoelectric semiconductor layer formed on a block copolymer substrate that comprises a block copolymer having microscopic pores, wherein the block copolymer comprises a polymer unit (A) formed of a monomer capable of forming a homopolymer having a glass transition temperature of 50° C. or higher, and a polymer unit (B) formed of a conjugated dienic polymer.

The thermoelectric semiconductor layer for use in the thermoelectric conversion material of the present invention is preferably formed of a p-type bismuth telluride or an n-type bismuth telluride.

The polymer unit (A) is preferably immiscible with the polymer unit (B) to be mentioned below, and is formed of a monomer capable of forming a homopolymer having a glass transition temperature of 50° C. or higher.

The polymer unit (A) of the type includes, for example, polystyrene; polystyrene derivatives such as o-polymethylstyrene, p-polymethylstyrene, polypropylstyrene, polymethoxystyrene, etc.; styrenic polymers such as copolymers of styrene and/or styrene derivative with any other monomer, etc.; polymethacrylates such as polymethyl methacrylate, polyethyl methacrylate, poly-t-butyl methacrylate, polycyclohexyl methacrylate, polybenzyl methacrylate, etc.; polyvinylpyridine derivatives such as poly-2-polyvinylpyridine, poly-4-vinylpyridine, etc. For the polymer unit (A), one resin alone or plural resins may be used either singly or as combined.

Of those, preferred are polystyrene, polystyrene derivatives such as o-polymethylstyrene, p-polymethylstyrene, polypropylstyrene, polymethoxystyrene, etc., and styrenic polymers such as copolymers of styrene and/or styrene derivative with any other monomer, etc., from the viewpoint of the heat resistance and the easiness in phase separation thereof, and more preferred is polystyrene.

The polymer unit (A) is formed of a monomer capable of forming a homopolymer having a glass transition temperature of 50° C. or higher. The monomer capable of forming a homopolymer having a glass transition temperature of 50° C. or higher provides excellent heat resistance and is favorably used for substrates for thermoelectric conversion materials. Accordingly, the temperature is preferably 80° C. or higher, more preferably 90° C. or higher. The upper limit of the glass transition temperature of the polymer (A) is not specifically defined, but is generally 200° or lower.

The glass transition temperature of the polymer unit (A) can be measured using a differential scanning calorimeter (DSC).

The conjugated dienic polymer unit (B) is preferably immiscible with the above-mentioned polymer unit (A). For example, there are mentioned linear conjugated dienes such as polyisoprene, polybutadiene, polypentadiene, polyhexadiene, etc.; polycyclic conjugated dienes such as polycyclopentadiene, policyclohexadiene, polycycloheptadiene, polycyclooctadiene and their derivatives, etc. For the polymer unit (B), one resin alone or plural resins may be used either singly or as combined.

Of those, preferred are linear conjugated dienes such as polyisoprene, polybutadiene, polypentadiene, polyhexadiene, etc., from the viewpoint of the easiness in phase separation and the easiness in etching thereof, and more preferred is polyisoprene.

The polymer unit (B) is preferably formed of a monomer capable of forming a homopolymer having a glass transition temperature of 20° C. or lower. When the glass transition temperature is 20° C. or lower, then phase separation of the unit from the above-mentioned polymer unit (A) would be easy, and the unit provides microscopic pores having a controlled structure. Preferably, the glass transition temperature is 10° C. or lower, more preferably 0° C. or lower. The lower limit of the glass transition temperature of the polymer unit (B) is not specifically defined but is generally −50° C. or higher.

The glass transition temperature of the polymer unit (B) may be measured using a differential scanning calorimeter (DSC).

The number-average molecular weight of the polymer unit (A) in the block copolymer is preferably from 500 to 500,000, more preferably from 10000 to 300,000.

The molecular weight of the polymer unit (A) of 500 or more is favorable since the polymer would not be lost through volatilization, evaporation or the like in high-temperature heat treatment and the performance of the substrate can be maintained. On the other hand, the molecular weight of the polymer unit (A) of 500,000 or more is favorable since the molecular mobility can be maintained and the phase separation can be promoted to control microscopic pores.

The number-average molecular weight of the polymer unit (B) in the block copolymer is preferably from 500 to 500,000, more preferably from 1000 to 100,000.

When the molecular weight of the polymer unit (B) falls within the above range, then it would be easy to remove the polymer unit (B) phase after phase separation and controlled microscopic pores can be thereby formed.

The molecular weight distribution (PDI: polydispersity index) of the polymer unit (A) is preferably 1.3 or less, and the molecular weight distribution (PDI) of the polymer unit (B) is preferably from 1 to 1.2. PDI of the polymer unit (A) falling within the above range is preferred as form in phase separation can be controlled and it is easy to control microscopic pores.

The molecular weight distribution of the polymer units (A) and (B) is calculated by measuring the number-average molecular weight (Mn) and the weight-average molecular weight (Mw) thereof through gel permeation chromatography (GPC) and using the molecular weight of standard polystyrene.

The content of the polymer unit (B) in the block copolymer is preferably from 1 to 40% by mass, more preferably from 10 to 35% by mass. The content of the polymer unit (B) of 1% by mass or more is preferred from the viewpoint of forming a cylinder or porous structure. The content of the polymer unit (B) of 40% by mass or less is preferred for forming a phase-separated structure.

The block copolymer of the present invention may be enough to comprise at least the above-mentioned polymer unit (A) and the polymer unit (B). For example, there are mentioned A-B, A-B-A and B-A-B block copolymers in which the polymer unit (A) bonds to the polymer unit (B). Also employable here are A-B-C or A-B-C-A block copolymers containing any other polymer unit.

Specific examples of the block copolymer include polystyrene-polyisoprene (PS-b-PI), polystyrene-polybutadiene (PS-b-PBD), polystyrene-polyisoprene-polybutadiene-polystyrene (SIBS resin), polyvinylpyridine-polybutadiene (PVP-b-PBD), polyvinylpyridine-polyisoprene (PVP-b-PI), polymethyl methacrylate-polyisoprene (PMMA-b-PI), polymethyl methacrylate-polybutadiene (PMMA-b-PB), etc.

Above all, preferred are polystyrene-polyisoprene (PS-b-PI), polystyrene-polybutadiene (PS-b-PBD) and polystyrene-polyisoprene-polybutadiene-polystyrene (SIBS resin), from the viewpoint of easiness in phase separation, easiness in controlling microscopic pores and heat resistance, and more preferred is polystyrene-polyisoprene (PS-b-PI).

The block copolymer comprising the above-mentioned polymer unit (A) and the polymer (B) for use herein may be one produced by polymerization or may be a commercially-available one. The polymerization method is not specifically defined, and any known method is employable. For example, the block copolymer may be obtained through living anionic polymerization using sec-butyllithium as the initiator. As commercial products, for example, those sold by Polymer Source and others are usable here.

(Block Copolymer Substrate)

The block copolymer substrate for use in the present invention is formed of a block copolymer that comprises the above-mentioned polymer unit (A) and the polymer unit (B) formed of a conjugated dienic polymer, and has microscopic pores.

The block copolymer substrate for use in the present invention may be prepared by forming a block copolymer layer on a support 1, then processing the block copolymer layer for micro-phase separation, and removing a part or all of the phase comprising the polymer unit (B) from the phase-separated block copolymer layer to thereby form microscopic pores.

First, the micro-phase separation of block copolymer is described briefly.

A block copolymer where different types of blocks are kept in phase separation from each other without mixing together therein takes a micro-domain structure characterized by a predetermined regularity. This is referred to as a micro-phase separated structure. For example, the micro-phase separated structure takes a micro-domain structure in which two types of polymer units constituting the block copolymer are kept phase-separated from each other by a scale of a molecular chain length or so, that is, by an order of several tens nanometers.

The micro-phase separated structure changes basically depending on the composition of the block copolymer, and can be grouped into a lamellar structure, a cylinder structure, a spherical structure, a gyroid structure, etc. More precisely, the micro-phase separated structure varies depending on the type of the monomers constituting the block copolymer, the combination thereof, the volume fraction thereof, and the type of the solvent to dissolve the different types of polymers to be used in film formation. In the present invention, the structure takes a cylinder structure in which the phase of the polymer unit (B) (hereinafter this may be referred to as polymer (B) phase) exists as a cylinder in the phase of the polymer unit (A) (hereinafter this may be referred to as polymer (A) phase).

Figure 1:
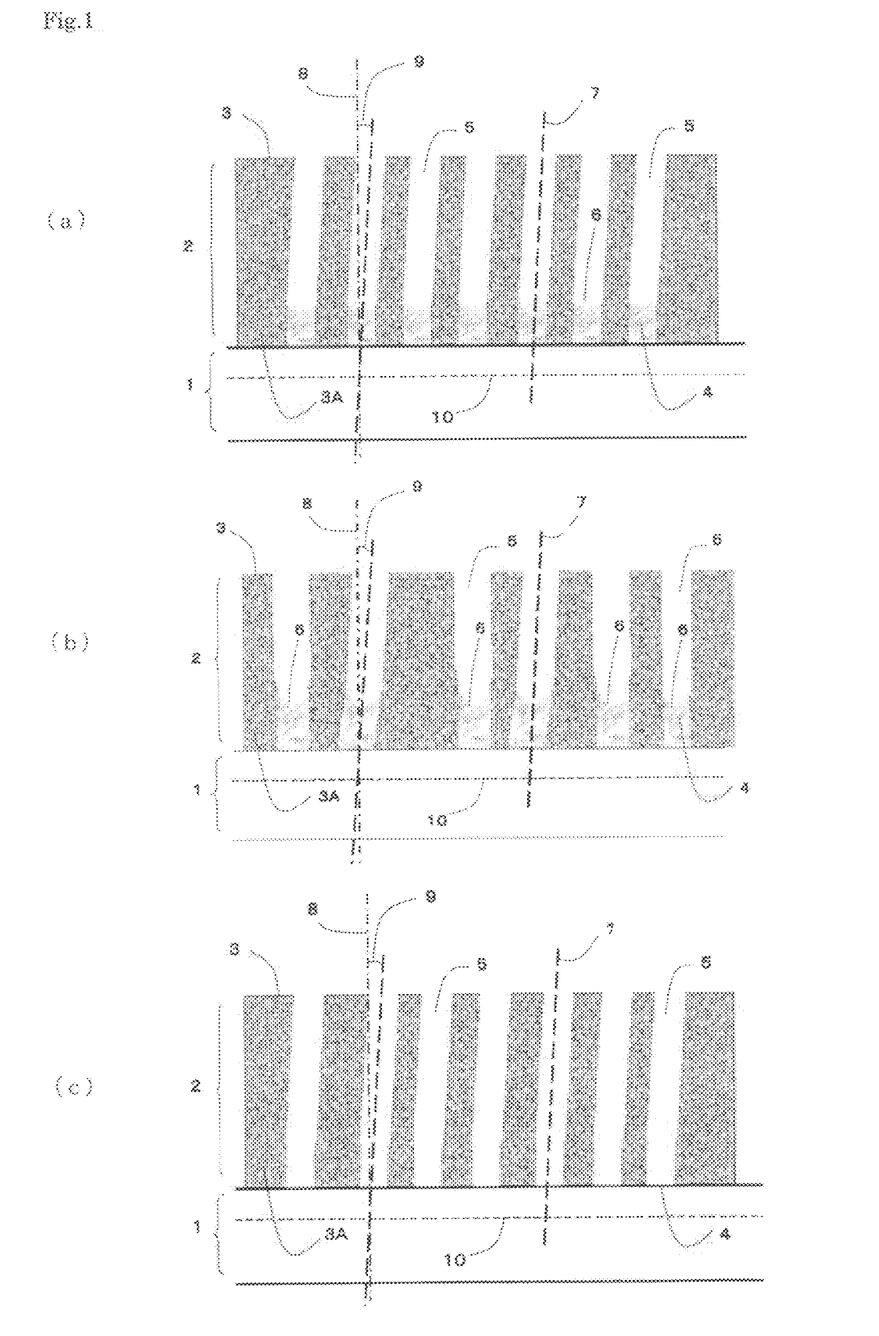
FIG. 1 schematically shows a cross section of the block copolymer substrate in the thermoelectric conversion material of the present invention, in which (a) is one example where the polymer unit (B) phase has been partly etched away, (b) is another example where the polymer unit (B) phase has been partly etched away, and (c) is a view where the polymer unit (B) phase has been completely removed by overetching.

FIG. 1 schematically shows a cross section of the block copolymer substrate in the thermoelectric conversion material of the present invention, in which (a) is one example where the polymer (B) phase has been partly etched away, (b) is another example where the polymer (B) phase has been partly etched away, and (c) is a view where the polymer (B) phase has been completely removed by overetching. In FIG. 1, the block copolymer substrate 2 is formed on the support 1 comprising glass, silicone or the like, and has microscopic pores 5. The block copolymer substrate 2 comprises the polymer (A) phase 3A, the polymer (B) phase 4, and a large number of microscopic pores 5 in the thickness direction of the block copolymer substrate 2.

The block copolymer substrate 2 may be arranged on the entire surface of the support 1, or may be arranged as plural independent substrates.

The shape of the microscopic pores 5 is not specifically defined, and for example, the inner bottom 6 thereof may be flat as in FIG. 1(a), or may not be flat as in FIG. 1(b).

As in FIG. 1(c), the polymer (B) phase 4 may be entirely removed. In the case of FIG. 1(c), the microscopic pores 5 are through-holes.

The film thickness of the block copolymer substrate 2 is preferably from 10 to 1,000 nm, more preferably from 50 to 250 nm. The film thickness of 10 nm or more is preferred as the thermal conductivity can fully lower. The film thickness of 1000 nm or less is preferred since the crystallinity does not increase and film formation is easy. The mean diameter of the microscopic pores 5 is preferably from 5 to 1,000 nm, more preferably from 10 to 300 nm, even more preferably from 30 to 150 nm. The mean diameter of 5 nm or more is preferred since the microscopic pores 5 are not clogged by the thermoelectric semiconductor layer even after film formation by vapor deposition or the like and therefore the independent (open) microscopic pores 5 can be maintained as such. The mean diameter of 1,000 nm or less is preferred since the thermal conversion material can secure the mechanical strength thereof and the thermal conductivity thereof can fully lower. The mean diameter of the microscopic pores 5 can be determined through SEM observation of the surface of the block copolymer substrate 2 (top surface in FIG. 1) at a measurement magnification of 30,000 times. Concretely, on the SEM picture, the maximum diameter and the minimum diameter of each pore size of the independent microscopic pores 5 existing in the field of view are read, the mean size is calculated from the found data, and thereafter the resulting mean size is processed for simple arithmetic average for the measured all microscopic pores to give the mean diameter.

The depth of the microscopic pores 5 is preferably from 5 to 1,000 nm, more preferably from 10 to 300 nm. The depth of 5 nm or more is preferred from the viewpoint that the independent microscopic pores 5 can be maintained as such.

The mean distance via which the microscopic pores 5 are arranged (center-to-center distance between neighboring pores) is preferably from 10 to 1,500 nm, more preferably from 10 to 300 nm, even more preferably from 10 to 150 nm. The mean distance of 10 nm or more is preferred as longer than the mean free path of electrons and therefore hardly causing electron scattering so that the electric conductivity is prevented from being lowered.

The mean distance of 1,500 nm or less is preferred as capable of reducing thermal transfer of phonons having a mean free path of 1,500 nm or more. The number of the microscopic pores 5 may be from $0.44 \times 10^8$ to $100 \times 10^8$ or so per mm$^2$, in a case where the mean distance is from 10 to 150 nm.

The angle 9 between the centerline 7 running through the microscopic pore 5 in the thickness direction of the substrate and the normal line 8 standing on the block copolymer substrate 2 is preferably within a range of ±15°, more preferably within a range of ±5°. The angle 9 to the normal line 8 falling within a range of ±15° is preferred since, for example, when a film of a thermoelectric semiconductor material such as a p-type bismuth telluride or the like is formed, the p-type bismuth telluride would hardly adhere to the inner wall surface of the microscopic pores 5. The angle 9 between the centerline 7 running through the microscopic pore 5 in the thickness direction of the substrate and the normal line 8 standing on the block copolymer substrate 2 is measured on an AFM picture (profile of the cross section of the block copolymer substrate 2) at a measurement magnification of 3 μm square.

In FIG. 1, the dotted line in the support 1 indicates a virtual line 10 parallel to the plane direction of the block copolymer substrate 2.

(Thermoelectric Semiconductor Layer)

The thermoelectric semiconductor layer for use in the thermoelectric conversion material of the present invention is a layer prepared by forming a thermoelectric semiconductor material into a film, and is formed on the above-mentioned block copolymer substrate 2. The thermoelectric semiconductor material to be used in the present invention includes, for example, a bismuth-tellurium-based thermoelectric semiconductor material such as a p-type bismuth telluride, an n-type bismuth telluride, $Bi_2Te_3$, etc.; a telluride-based thermoelectric semiconductor material such as GeTe, PbTe, etc.; an antimony-tellurium-based thermoelectric semiconductor material; a zinc-antimony-based thermoelectric semiconductor material such as ZnSb, $Zn_3Sb_2$, $Zn_4Sb_3$, etc.; a silicon-germanium-based thermoelectric semiconductor material such as SiGe, etc.; a bismuth-selenide-based thermoelectric semiconductor material such as $Bi_2Se_3$, etc., a silicide-based thermoelectric semiconductor material such as β-$FeSi_2$, $CrSi_2$, $MnSi_{1.73}$, $Mg_2Si$, etc.; an oxide-based thermoelectric semiconductor material; a Heusler material such as FeVAl, FeVAlSi, FeVTiAl, etc. Of those, preferred is a bismuth-tellurium-based thermoelectric semiconductor material such as a p-type bismuth telluride, an n-type bismuth telluride, $Bi_2Te_3$, etc.

The method for forming the thermoelectric semiconductor material into a film is not specifically defined. For example, on the block copolymer substrate 2, a film of a thermoelectric semiconductor material such as a p-type bismuth telluride may be formed to be the thermoelectric semiconductor layer, by a flash vapor deposition method or the like, thereby providing the thermoelectric conversion material of the present invention.

The thermoelectric semiconductor layer may be formed on the block copolymer substrate 2 as a film of a thermoelectric semiconductor material thereon. For lowering the thermal conductivity of the thermoelectric conversion material, it is desirable that the thermoelectric semiconductor layer is so formed as to maintain the electric insulation between the inner bottom 6 of the microscopic pore 5 and the top 3 of the block copolymer substrate 2. The thermoelectric semiconductor layer may exist on the top 3 of the block copolymer substrate 2 and in the inner bottom 6 of the microscopic pore 5, or may exist only on the top 3 of the block copolymer substrate 2 but not existing in the inner bottom 6 of the microscopic pore 5. In particular, it is desirable that the thermoelectric semiconductor layer exists both on the top 3 of the block copolymer substrate 2 and in the inner bottom 6 of the microscopic pore 5.

The thickness of the thermoelectric semiconductor layer on the top 3 of the block copolymer substrate 2 is preferably from 10 to 500 nm, more preferably from 10 to 300 nm, even more preferably from 50 to 250 nm. The film thickness falling within the above-mentioned range on the top 3 is preferred since the inner bottom 6 and the top 3 do not form a continuous layer and can maintain electric insulation therebetween, and therefore the thermoelectric semiconductor layer can be thus formed while reducing the material cost and improving the productivity.

The thickness of the thermoelectric semiconductor layer in the inner bottom 6 of the microscopic pore 5 is preferably from 5 to 200 nm, more preferably from 5 to 100 nm. The film thickness falling within the above-mentioned range in the inner bottom 6 is preferred since the microscopic pore 5 is not filled with the thermoelectric semiconductor layer and the shape of the microscopic pore 5 can be maintained as such.

The method for forming the layer of the thermoelectric semiconductor material is not specifically defined, and for example, the layer may be formed by a flash vapor deposition method, a vacuum arc vapor deposition method or the like.

(P-Type Bismuth Telluride)

Of the p-type bismuth telluride for use in the thermoelectric conversion material of the present invention, the carrier is a hole and the Seebeck coefficient thereof is a positive value. The p-type bismuth telluride is preferably $BiXTe_3Sb_{2-X}$ (where X is preferably $0<X\leq0.6$, more preferably $0.4<X\leq0.6$). X of more than 0 and 0.6 or less is preferred since the Seebeck coefficient and the electric conductivity of the material are large and the material can maintain the characteristics of p-type thermoelectric conversion material. As the p-type bismuth telluride, concretely mentioned is $Bi_{0.4}Te_3Sb_{1.6}$.

(N-Type Bismuth Telluride)

Of the n-type bismuth telluride for use in the thermoelectric conversion material of the present invention, the carrier is an electron and the Seebeck coefficient thereof is a negative value. The n-type bismuth telluride is preferably $Bi_2Te_{3-Y}Se_Y$ (where Y is preferably $0<Y\leq3$, more preferably $0.1<Y\leq2.7$). Y of more than 0 and 3 or less is preferred since the Seebeck coefficient and the electric conductivity of the material are large and the material can maintain the characteristics of n-type thermoelectric conversion material. As the n-type bismuth telluride, concretely mentioned is $Bi_2Te_{2.7}Se_{0.3}$.

One alone of the p-type bismuth telluride or the n-type bismuth telluride may be used in the present invention, but preferably these are used as a pair of them. For example, plural pairs of them may be used as electrically connected in series to each other via an electrode, and as thermally connected in parallel to each other via an insulating material such as ceramics or the like, and can be used as a thermoelectric conversion device for power generation or for cooling.

The thermoelectric conversion material of the present invention can be produced according to a process comprising a substrate formation step of forming the microscopic pores-having block copolymer substrate 2 and a film formation step of forming a thermoelectric semiconductor layer from a thermoelectric semiconductor material. More precisely, it is desirable that the substrate formation step comprises a step of forming a block copolymer layer, a phase separation step of annealing the block copolymer layer in a solvent atmosphere for micro-phase separation, and a microscopic pores formation step of removing a part or all of the micro-phase separated block copolymer layer to form microscopic pores.

(1) Substrate Formation Step (1)-1 Block Copolymer Layer Formation Step

The block copolymer layer formation step is a step of applying a solution prepared by dissolving the above-mentioned block copolymer, for example, in an organic solvent, onto the support 1 to form a block copolymer layer thereon.

The support 1 is not specifically defined so far as a block copolymer layer may be uniformly formed thereon not having any influence on the reduction in the electric conductivity of the thermoelectric conversion material and on the increase in the thermal conductivity thereof. For example, there are mentioned glass, silicon, ITO substrate, plastic substrate, etc.

The support 1 may be peeled off after the substrate formation step or the film formation step to be mentioned below. However, from the viewpoint of the ability thereof to mechanically support the substrate having the microscopic pores 5, it is desirable that the support is laminated with the block copolymer substrate 2, as in FIG. 1.

The formation method for the block copolymer layer is not specifically defined, including, for example, spin coating, roll coating, dip coating, die coating, gravure coating, etc. In case where a block copolymer layer on an order of a few nm is uniformly formed in the entire region of the substrate surface, especially preferred is spin coating, die coating or gravure coating.

The solvent to dissolve the block copolymer for use in the present invention includes cyclopentanone, toluene, ethyl acetate, chloroform, THF, benzene and cyclohexanone, from the viewpoint of forming a micro-phase separated structure having a cylinder structure; and especially from the viewpoint of the evaporation speed thereof, preferred is cyclopentanone.

The concentration of the block copolymer in the block copolymer solution is not specifically defined, but is preferably from 0.1 to 20% by mass, more preferably from 0.5 to 10% by mass. The block copolymer concentration of 0.1% by mass or more is preferred from the viewpoint of uniformly forming the block copolymer layer having a thickness on an order of a few nm. The block copolymer concentration of 20% by mass or less is preferred from the viewpoint of preventing crystallization in film formation.

(1)-2 Micro-Phase Separation Step

The phase separation step is a step of processing the block copolymer layer formed in (1)-1, through solvent treatment to form a micro-phase separated structure having a cylinder structure.

As the method for forming the micro-phase separated structure having a cylinder structure, there is mentioned a step of keeping the block copolymer layer formed in (1)-1 in a solvent vapor atmosphere for a predetermined period of time to thereby form the micro-phase separated structure having a cylinder structure (solvent annealing method). According to the solvent annealing method, the micro-phase separated structure having a cylinder structure is oriented vertically to the surface of the block copolymer substrate 2.

The solvent to be used in the solvent annealing is preferably a good solvent for both components of the polymer unit (A) and the polymer unit (B), and for example, there are mentioned toluene, a mixed solvent of toluene and hexane, carbon disulfide, benzene, THF, etc. Of those solvents, preferred is a mixed solvent of toluene and hexane from the viewpoint of the high affinity thereof to the two polymer components constituting the block copolymer.

As in the above, using the solvent in the solvent annealing method well controls the micro-phase-separated structure at a high level and makes it possible to form the microscopic pores 5 whose depth, mean diameter, shape, and the like are controlled.

Though not always clear, the mechanism of forming a micro-phase separated structure through solvent treatment employed in the present invention could be considered as the following: First, in the vapor atmosphere of the solvent used, the solvent penetrates into the block copolymer layer to swell the block copolymer layer. Next, the polymer chains fixed during the formation of the block copolymer layer again become movable thereby providing self-reorganization owing to the interaction by the repulsive force between different types of polymers to give a clear micro-phase-separated structure. Simultaneously, in addition, the components of the polymer unit (A) and the polymer unit (B) become miscible with the solvent to form domains on the surface of the block copolymer layer. In this stage, however, any one polymer alone could not provide surface segregation. Further, the surface of the block copolymer layer kept in contact with the solvent acts as a trigger to promote self-organization in the thickness direction of the substrate, and finally provides a block copolymer layer in which the micro-phase separated structure having a cylinder structure is oriented vertically to the substrate surface.

(1)-3 Microscopic Pores Formation Step

The microscopic pores formation step is a step of forming microscopic pores by removing a part or all of the polymer (B) phase from the block copolymer layer that has been micro-phase separated as a cylinder structure in (1)-2.

The method of removing the polymer (B) phase is not specifically defined. For example, there is mentioned an etching method through ozone treatment, oxygen plasma treatment, etc. Above all, preferred is ozone treatment from the viewpoint that it is easy to control the depth, the mean diameter, the shape, and the like of the microscopic pores to be formed.

In the micro-phase separated block copolymer layer, the etching resistance to the above-mentioned ozone treatment of the polymer (A) phase is higher than that of the polymer (B) phase, and differs from the latter in the etching speed ratio by one order or so. Consequently, in the ozone treatment, the polymer (B) phase having a low etching resistance, that is, having a high etching speed is selectively etched away to form microscopic pores. The ozone treatment is a treatment of chemically converting the organic compound of the target substance to be treated into water and carbon dioxide by the action of ozone to thereby remove the substance.

Concretely, as the ozone treatment, for example, preferred is a treatment of chemically converting the organic compound of the target substance to be treated into water and carbon dioxide by the action of ozone that is generated by the use of an apparatus equipped with, as a light source, a low-pressure mercury lamp or the like capable of simultaneously radiating a UV ray having a wavelength of 184.9 nm and a UV ray having a wavelength of 253.7 nm, in an oxygen atmosphere (oxygen in air can be used), to thereby remove the substance (UV-ozone treatment). Depending on the ozone treatment condition (oxygen amount, treatment time, etc.), the etching amount, that is, the depth of microscopic pores can be controlled.

However, according to the UV-ozone treatment, it may be often difficult to selectively remove one organic compound, that is, in the present invention, to selectively remove the polymer (B) phase. Accordingly, since the polymer (B) phase can be selectively etched away with ozone rather than the polymer (A) phase, it is desirable that the UV ray at a wavelength of 253.7 nm capable of promoting the decomposition of ozone is cut off during ozone treatment and the UV ray at a wavelength of 184.9 nm alone capable of promoting the formation of ozone is made to penetrate through the target for UV-ozone treatment. The method is not specifically defined, for which, for example, usable is an optical filter that can cut off a light having a wavelength of 253.7 nm or so and can transmit a light having a wavelength of 184.9 nm. With that, the polymer (B) phase can be selectively removed. Etching may be as in FIG. 1(c), in which the polymer (B) 4 phase may be overetched to completely remove the polymer (B) phase 4 thereby making the microscopic pores (5) through-holes, or the etching may be stopped along the way, and as in FIGS. 1(a) and 1(b), a part of the polymer (B) phase may be kept remaining. The depth of the microscopic pores (5) can be one parameter to control the performance of the thermoelectric conversion element, and therefore it is desirable that the removing amount of the polymer (B) phase is suitably selected.

As in the above, the polymer (B) phase is selectively removed by the ozone treatment to form the microscopic pores 5, and the block copolymer substrate 2 for use in the present invention, which has the microscopic pores 5 whose depth, mean diameter, shape, and the like are highly controlled, is thus produced.

(2) Film Formation Step

In the present invention, the film formation step is a step of forming a film of a thermoelectric semiconductor material such as a p-type bismuth telluride, an n-type bismuth telluride or the like on the block copolymer substrate 2, after the above-mentioned substrate formation step, to thereby form a thermoelectric semiconductor layer thereon. Here, the film formation step is not specifically defined, for which preferred is a flash vapor deposition method or a vacuum arc vapor deposition method. Above all, more preferred is a flash vapor deposition method as enabling film formation with accuracy.

(Film Formation According to Flash Vapor Deposition Method)

The flash vapor deposition method is a vapor deposition method for film formation in which a granular film-forming material is continuously and little by little supplied into a crucible or a boat-type heater previously heated, for example, at a temperature not lower than the boiling point of the material and the material is instantaneously evaporated to form a film thereof. In vapor deposition according to the process, the material is instantaneously evaporated, and therefore, in particular, in case where an alloy comprising two or more different types of elements each having a different vapor pressure is vaporized, the compositional ratio can be kept more constantly as compared with a vapor deposition method in which the evaporation source of the material to be evaporated is fixed on a heater and evaporated thereon by heating.

In addition, according to the method, the evaporation material does not scatter and an unevaporated residue does not remain so that the evaporation material can be efficiently utilized and the production cost can be reduced. Further, according to the flash vapor deposition method, the straight-running capability of the evaporation material during vapor deposition is high, and therefore the material is hardly deposited on the wall surface inside the microscopic pores. This is another advantage of the method.

Figure 2:
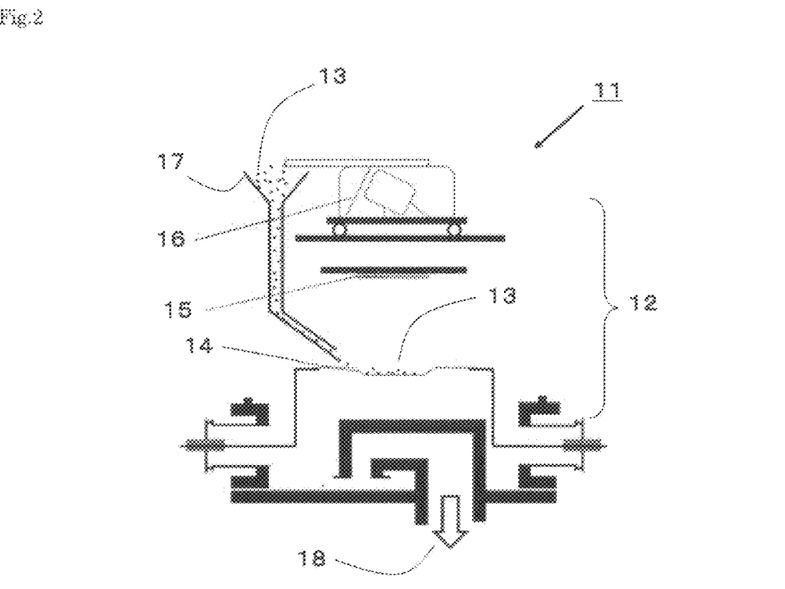
FIG. 2 is a schematic outline view of a flash vapor deposition apparatus used in Examples and Comparative Examples.

An example of the apparatus usable for the flash vapor deposition method is described. FIG. 2 is a schematic outline view of a flash vapor deposition apparatus used in Examples and Comparative Examples. In FIG. 2, 11 is a flash vapor deposition apparatus, 12 is a vacuum chamber, 13 is an evaporation material, and 14 is a heater.

In the vacuum chamber 12, as the heater 14 to heat and vaporize the evaporation material 13, for example, the boat-type heater 14 is used. As the material of the heater 14, generally used is a high-melting point metal such as typically tungsten, molybdenum, tantalum, niobium or the like, and the material may be suitably selected in accordance with the physical properties of the evaporation material 13, such as the melting point, the boiling point, the sublimation temperature and others thereof. The block copolymer substrate 15 is generally arranged at the position to face the heater 14.

The flash vapor deposition apparatus 11 is equipped with a mechanism of continuously and little by little feeding the vapor deposition material 13, which is one characteristic feature of flash vapor deposition. Concretely, the mechanism is, for example, so planned that an electromagnetic feeder 16 is provided above the flash vapor deposition apparatus 11, and particles of the vapor deposition material 13 are fed from the electromagnetic feeder 16 to the funnel 17 so that a predetermined amount of the vapor deposition material 13 can be continuously dropped onto the heater 14 via the funnel 17.

Vapor deposition is carried out as follows: The flash vapor deposition apparatus 11 is degassed through the vacuum exhaust port 18 so that the vacuum chamber 12 is depressurized to a predetermined vacuum degree, and after this is kept as such for a predetermined period of time, a current is applied to the heater 14 so that the heater 14 is heated.

The block copolymer substrate 15 is heated up to a predetermined temperature, kept as such for a predetermined period of time, and thereafter the evaporation material 13 is dropped down onto the heater 14 to start vapor deposition. The evaporation material 13 is instantaneously vaporized and adheres to the facing block copolymer substrate 15 to attain vapor deposition thereon.

After vapor deposition, the current supply to the heater 14 is stopped, the substrate 15 is cooled down to a predetermined temperature or lower, and the vacuum chamber 12 is opened to finish the flash vapor deposition.

EXAMPLES

Next, the present invention is described in more detail by reference to the Examples, but it should be construed that the present invention is not limited to these Examples at all.

The thermoelectric performance of the thermoelectric conversion materials produced in Examples and Comparative Examples was evaluated according to the methods mentioned below, in which the thermal conductivity, the Seebeck coefficient and the electric conductivity of each material were calculated.

(a) Thermal Conductivity

The thermal conductivity was calculated according to $3\omega$ method.

(b) Seebeck Coefficient

According to JIS C 2527:1994, the thermoelectromotive force of the thermoelectric conversion material produced in Examples and Comparative Examples was measured, and the Seebeck coefficient was calculated. One end of the sample produced was heated, and the resulting temperature difference between both ends of the sample was measured using a chromel-alumel thermocouple, and from the electrode adjacent to the thermocouple installation position, the thermoelectromotive force was measured. Concretely, the distance between both ends of the sample of which the temperature difference and the electromotive force are to be measured was to be 25 mm, one end was kept at 20°, and the other end was heated from 25° to 50° at intervals of 1°, whereupon the thermoelectromotive force was measured and the Seebeck coefficient was calculated from the inclination. The thermocouple installation position and the electrode installation position are symmetric to each other relative to the centerline of the thin film, and the distance between the thermocouple and the electrode is 1 mm.

(c) Electric Conductivity

Using a surface resistivity meter (Mitsubishi Chemical's trade name: Loresta GP MCP-T600) and according to a four-terminal method, the surface resistivity of each sample of the thermoelectric conversion materials produced in Examples and Comparative Examples was measured, and the electric conductivity thereof was calculated.

Example 1

(1) Production of Block Copolymer Substrate (Substrate Production Step)

A block copolymer layer was formed on a support 1 in the manner mentioned below, and a block copolymer substrate 2 was produced through micro-phase separation treatment in solution followed by removal of the polymer (B) phase through UV-ozone treatment.

(Block Copolymer Layer Formation Step)

A block copolymer PS-b-PI comprising a polystyrene (PS) unit and a polyisoprene (PI) unit (the glass transition temperature of the PS unit is 100° C., the number-average molecular weight of the PS unit is 72000, the number-average molecular weight of the PI unit is 13000, the PI content in the block copolymer is 15% by mass; "72000-b-13000") (Polymer Source's "P4014-PIp") was dissolved in cyclopentanone (Tokyo Chemical Industry's chemical reagent) to prepare a polymer solution having a solution concentration of 1% by mass. The prepared polymer solution was applied onto a glass substrate of the support 1 according to a spin coating method, thereby forming a block copolymer layer having a thickness of 150 nm.

(Micro-Phase Separation Step)

Next, using a solution of toluene/hexane=70/30% by volume, the formed block copolymer layer was processed for solvent annealing treatment for 30 minutes in a solvent vapor atmosphere. After the micro-phase separation, the structure of the resulting thin film was evaluated through AFM.

(Microscopic Pores Formation Step)

Figure 3:
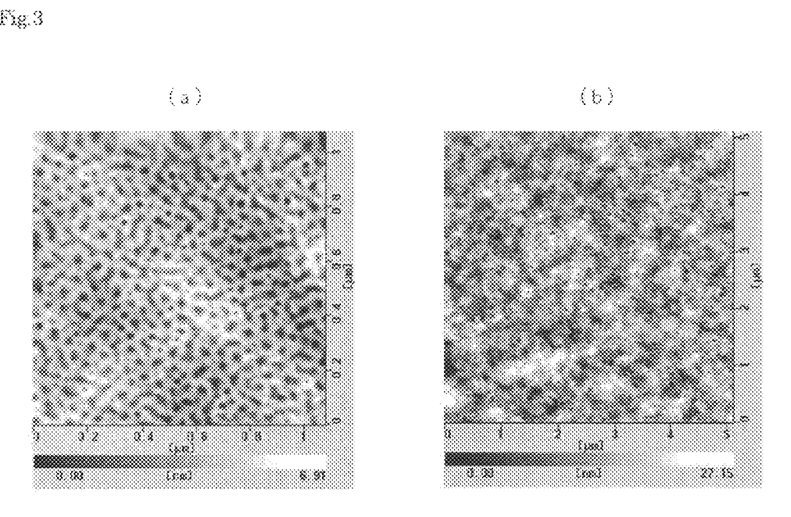
FIG. 3 shows a plane surface of the microscopic pores obtained in Example 1 of the present invention, in which (a) is an AFM photograph (measurement range, 1,000 nm×1,000 nm) after microphase separation, and (b) is an AFM photograph (measurement range, 5,000 nm×5,000 nm) after UV-ozone treatment.

In the subsequent microscopic pores formation step, the thin film was processed for UV-ozone treatment using an optical filter capable of cutting a wavelength of 253.7 nm (Samco's UV-Ozone Dry Stripper) to remove the polyisoprene phase, and then washed with a hexane solvent, thereby giving a block copolymer substrate 15. The obtained block copolymer substrate 15 was evaluated through SEM observation. FIG. 3 shows a plane surface of the microscopic pores obtained in Example 1, in which (a) is an AFM photograph after micro-phase separation, and (b) is an AFM photograph after UV-ozone treatment.

(2) Formation of P-Type Bismuth Telluride Film (Film Formation Step)

On the block copolymer substrate 15 produced in the previous (1), a p-type bismuth telluride film of a thermoelectric semiconductor layer was formed by a flash vapor deposition method thereby producing a thermoelectric conversion material.

In the vacuum chamber 12 of the flash vapor deposition apparatus 11 shown in FIG. 2, a boat-type tungsten heater was used as the heater 14 for heating and vaporizing the evaporation material 13 therein, and the block copolymer substrate 15 produced in (1) was arranged at the position (15 cm) facing to the heater 14.

Next, the chamber was degassed through the vacuum exhaust port 18 of the flash vapor deposition apparatus 11 so as to decrease the pressure therein to a vacuum degree of $1.4 \times 10^{-3}$ Pa, then the vacuum degree was stabilized, and thereafter a current of 80 A was applied to the tungsten heater 14 to heat the substrate. The substrate temperature was controlled to be not higher than 100° C. with cooling water kept applied to the system. The p-type bismuth telluride ($Bi_{0.4}Te_3Sb_{1.6}$) of the evaporation material 13 was continuously and little by little dropped down onto the boat-type tungsten heater for film formation at a mean vapor deposition rate of 0.17 (nm/sec) and for a vapor deposition time of 600 (sec), thereby producing a thermoelectric conversion material.

Figure 4:
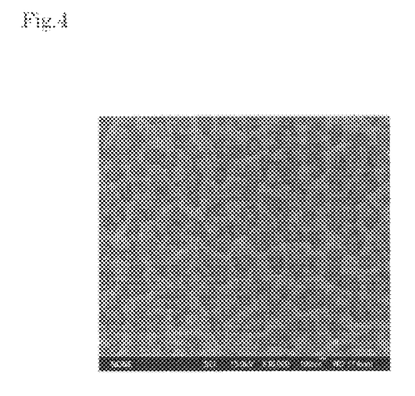
FIG. 4 is a SEM photograph (measurement magnification 30000 times) showing a plane surface of the microscopic pores of the thermoelectric conversion material using a p-type bismuth telluride, obtained in Example 1 of the present invention.

FIG. 4 is a SEM photograph showing a plane surface of the microscopic pores of the thermoelectric conversion material using a p-type bismuth telluride, obtained in Example 1 of the present invention. As shown in FIG. 4, it is known that the surface of the block copolymer substrate 15 having a film of the p-type bismuth telluride ($Bi_{0.4}Te_3Sb_{1.6}$) had independent microscopic pores. The thickness of the surface of the block copolymer formed of a film of p-type bismuth telluride ($Bi_{0.4}Te_3Sb_{1.6}$) was 100 nm and the thickness of the bottom of the microscopic pores 5 was 20 nm. The mean diameter of the microscopic pores 5 was calculated from FIG. 4. The results are shown in Table 1.

Figure 5:
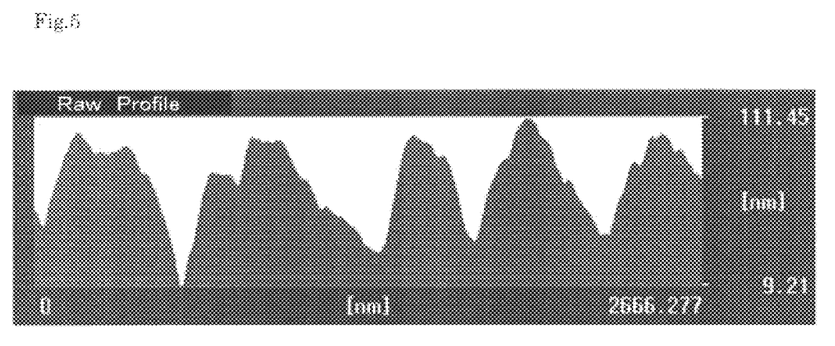
FIG. 5 is a surface profile with AFM (measurement range 100 nm×2,700 nm) showing a cross section of the microscopic pores of thermoelectric conversion material using a p-type bismuth telluride, obtained in Example 1 of the present invention.

FIG. 5 is a surface profile with AFM showing a cross section of the microscopic pores 5 of thermoelectric conversion material using a p-type bismuth telluride, obtained in Example 1 of the present invention. From FIG. 5, the depth of the microscopic pores 5 was calculated. The results are shown in Table 1. As obvious from FIG. 5, the cross section of some microscopic pores 5 is somewhat tilted in the thickness direction of the block copolymer substrate 15, but the centerline 7 running through each microscopic pore is fully within a range of ±15° relative to the normal line standing from the block copolymer substrate 2.

The thermoelectric performance evaluation results are shown in Table 1.

Example 2

A thermoelectric conversion material was produced in the same manner as in Example 1 except that, as the block copolymer, a block copolymer of PS-b-PI, in which the number-average molecular weight of the PS unit was 36000 and the number-average molecular weight of the PI unit was 7500 ("36000-b-7500", the glass transition temperature of the PS unit is 98° C., and the PI content in the block copolymer is 17% by mass), was used.

Example 3

A thermoelectric conversion material was produced in the same manner as in Example 1 except that, as the block copolymer, a block copolymer of PS-b-PI, in which the number-average molecular weight of the PS unit was 144000 and the number-average molecular weight of the PI unit was 26000 ("144000-b-26000", the glass transition temperature of the PS unit is 105° C., and the PI content in the block copolymer is 15% by mass), was used.

Example 4

A thermoelectric conversion material was produced in the same manner as in Example 1 except that the thermoelectric semiconductor material was changed to an n-type bismuth telluride ($Bi_{2.0}Te_{2.7}Se_{0.3}$).

Comparative Example 1

A thermoelectric conversion material was produced in the same manner as in Example 1 except that the micro-phase separation step and the microscopic pores formation step for the block copolymer substrate were omitted.

Comparative Example 2

A thermoelectric conversion material was produced in the same manner as in Example 4 except that the micro-phase separation step and the microscopic pores formation step for the block copolymer substrate were omitted.

The thermoelectric performance evaluation results are shown in Table 1.

TABLE 1

|  | Example 1 | Example 2 | Example 3 | Example 4 | Comparative Example 1 | Comparative Example 2 |
|---|---|---|---|---|---|---|
| Solvent Annealing Treatment Time in Micro-Phase Separation Step (min) | 30 | 30 | 30 | 30 | — | — |
| UV-Ozone Treatment Time in Micropore Formation Step (sec) | 30 | 30 | 30 | 30 | — | — |
| Semiconductor Layer: p-type bismuth telluride (nm) | 100 | 100 | 100 |  | 100 |  |
| Semiconductor Layer: n-type bismuth telluride (nm) |  |  |  | 100 |  | 100 |
| Mean Diameter of Microscopic pores (nm) | 120 | 80 | 100 | 120 | — | — |
| Depth of Microscopic pores (nm) | 40 | 50 | 42 | 40 | — | — |
| Thermal Conductivity λ(W/mK) | 0.27 | 0.20 | 0.32 | 0.25 | 1.2 | 1.0 |
| Electric Conductivity σ (S/cm) | 180 | 160 | 165 | 200 | 145 | 190 |
| Seebeck Coefficient S(μV/K) | 170 | 180 | 170 | −90 | 170 | −87 |
| Thermoelectric Performance Index $Z = \sigma S^2/\lambda$ ($K^{-1}$) | $1.93 \times 10^{-3}$ | $2.60 \times 10^{-3}$ | $1.50 \times 10^{-3}$ | $0.65 \times 10^{-3}$ | $0.33 \times 10^{-3}$ | $0.14 \times 10^{-3}$ |
| Non-Dimensional Thermoelectric Performance Index ZT (T: 300 K) | 0.58 | 0.78 | 0.45 | 0.2 | 0.1 | 0.04 |

Of the thermoelectric conversion materials of Examples 1 to 4, the thermal conductivity lowered greatly, as compared with that of the thermoelectric conversion materials of Comparative Examples 1 and 2 where the block copolymer substrate for which the micro-phase separation step and the microscopic pores formation step had been omitted and on which the microscopic pores had not been formed was used, and the electric conductivity of the former was high, and in addition, the non-dimensional thermoelectric performance index ZT value of the former was high.

INDUSTRIAL APPLICABILITY

The thermoelectric conversion material of the present invention is formed into a thermoelectric conversion element that carries out energy interconversion between heat and electricity, and is set in a module and put into practical use. Concretely, the material is a high-efficiency thermoelectric conversion material and is therefore considered to be applicable to use for conversion of exhaust heat from industries and various combustion furnaces such as wastes incinerators, cement combustors and the like, as well as combustion gas exhaust heat from automobiles and exhaust heat from electronic instruments, into electricity.

REFERENCE SIGNS LIST

1: Support
2: Block Copolymer Substrate
3: Top
3A: Polymer (A) Phase
4: Polymer (B) Phase
5: Microscopic pore
6: Inner Bottom
7: Centerline Passing Through Microscopic pore
8: Normal Line Standing From Block Copolymer Substrate
9: Angle between Centerline Passing Through Microscopic pore and Normal Line
10: Virtual Line Drawn Parallel to Block Copolymer Substrate
11: Flash Vapor Deposition Apparatus
12: Vacuum Chamber
13: Evaporation Material
14: Heater
15: Block Copolymer Substrate
16: Electromagnetic Feeder
17: Funnel
18: Vacuum Exhaust Port

The invention claimed is:

1. A thermoelectric conversion material, comprising:
a non-contiguous thermoelectric semiconductor layer present on a block copolymer substrate that comprises a block copolymer and has microscopic pores within the block copolymer substrate,
wherein
the block copolymer comprises a polymer unit (A) comprised of at least one unit selected from the group consisting of polystyrene, an o-polymethylstyrene, a p-polymethylstyrene, a polypropylstyrene, a polymethoxystyrene, a polymethyl methacrylate, a polyethyl methacrylate, a poly-t-butyl methacrylate, a polycyclohexyl methacrylate, a polybenzyl methacrylate, a poly-2-vinylpyridine, and a poly-4-vinylpyridine, said polymer unit (A) having a glass transition temperature of 50° C. or higher,
and a polymer unit (B) comprised of a conjugated dienic polymer,
wherein the non-contiguous thermoelectric semiconductor layer has a first portion of the layer that only partially fills the microscopic pores of the block copolymer substrate and is present in an inner bottom portion of the microscopic pores of the block copolymer substrate,
wherein the non-contiguous thermoelectric semiconductor layer has a second portion of the layer that is present on the top of the block copolymer substrate,
wherein the microscopic pores have a depth of from 5 to 1,000 nm and have a mean diameter of from 5 to 1,000 nm,
wherein a mean distance between the microscopic pores is from 10 to 1,500 nm,
wherein the first portion of the non-contiguous thermoelectric semiconductor layer has a thickness of from 5 to 200 nm, and
wherein the second portion of the non-contiguous thermoelectric semiconductor layer has a thickness of from 10 to 500 nm.

2. The thermoelectric conversion material according to claim 1, wherein the polymer unit (A) is comprised of polystyrene.

3. The thermoelectric conversion material according to claim 1, wherein the polymer unit (B) is comprised of polyisoprene.

4. The thermoelectric conversion material according to claim 1, wherein
the polymer unit (A) in the block copolymer has a number-average molecular weight of from 500 to 500,000,
the polymer unit (B) in the block copolymer has a number-average molecular weight of from 500 to 500,000, and
the amount of polymer unit (B) in the block copolymer is from 1 to 40% by mass, relative to the total mass of polymer unit (A) and polymer unit (B).

5. The thermoelectric conversion material according to claim 1, wherein each of the first and second portions of the non-contiguous thermoelectric semiconductor layer comprises a p-type bismuth telluride or an n-type bismuth telluride.

6. The thermoelectric conversion material according to claim 1, wherein each of the first and second portions of the non-contiguous thermoelectric semiconductor layer comprises a p-type bismuth telluride, where the p-type bismuth telluride is $Bi_X Te_3 Sb_{2-X}$ where $0<X\leq 0.6$.

7. The thermoelectric conversion material according to claim 1, wherein each of the first and second portions of the non-contiguous thermoelectric semiconductor layer comprises a n-type bismuth telluride, where the n-type bismuth telluride is $Bi_{2.0} Te_{3-Y} Se_Y$ where $0<Y\leq 3$.

8. The thermoelectric conversion material according to claim 1, wherein the polymer unit (B) has a glass transition temperature of 20° C. or less.

9. The thermoelectric conversion material according to claim 1, wherein a molecular weight distribution of polymer unit (A) is 1.3 or less, and the molecular weight distribution of polymer unit (B) is from 1.0 to 1.2.

10. The thermoelectric conversion material according to claim 1, wherein
polymer unit (B) is comprised of at least one of polyisoprene, polybutadiene, polypentadiene, polyhexadiene, polycyclopentadiene, policyclohexadiene, polycycloheptadiene, and polycyclooctadiene.

11. The thermoelectric conversion material according to claim 1, wherein
polymer unit (B) is comprised of polybutadiene.

12. The thermoelectric conversion material according to claim 1, wherein the non-contiguous thermoelectric semiconductor layer is formed by flash vapor deposition.

13. The thermoelectric conversion material according to claim 1, wherein
the first portion of the non-contiguous thermoelectric semiconductor layer is only partially filled in the microscopic pores by flash vapor deposition.

14. The thermoelectric conversion material according to claim 1,
wherein the first portion of the non-contiguous thermoelectric semiconductor layer has a thickness of from 5 to 100 nm, and
wherein the second portion of the non-contiguous thermoelectric semiconductor layer has a thickness of from 10 to 300 nm.

15. A thermoelectric conversion material, comprising:
a non-contiguous thermoelectric semiconductor layer present on a block copolymer substrate that comprises a block copolymer and has microscopic pores within the block copolymer substrate, wherein
the block copolymer comprises a polymer unit (A) comprised of at least one unit selected from the group consisting of polystyrene, an o-polymethylstyrene, a p-polymethylstyrene, a polypropylstyrene, a polymethoxystyrene, a polymethyl methacrylate, a polyethyl methacrylate, a poly-t-butyl methacrylate, a polycyclohexyl methacrylate, a polybenzyl methacrylate, a poly-2-vinylpyridine, and a poly-4-vinylpyridine, said polymer unit (A) having a glass transition temperature of 50° C. or higher,
and a polymer unit (B) comprised of a conjugated dienic polymer,
wherein the non-contiguous thermoelectric semiconductor layer has a first portion of the layer that partially fills the microscopic pores of the block copolymer substrate and is present in an inner bottom portion of the microscopic pores of the block copolymer substrate,
wherein the non-contiguous thermoelectric semiconductor layer has a second portion of the layer that is present on the top of the block copolymer substrate and the second portion of the non-contiguous thermoelectric semiconductor layer at least partially covers the top of the block copolymer substrate,
wherein the microscopic pores have a depth of from 5 to 1,000 nm and have a mean diameter of from 5 to 1,000 nm,
wherein a mean distance between the microscopic pores is from 10 to 1,500 nm,
wherein the first portion of the non-contiguous thermoelectric semiconductor layer has a thickness of from 5 to 200 nm, and
wherein the second portion of the non-contiguous thermoelectric semiconductor layer has a thickness of from 10 to 500 nm.

* * * * *